(12) United States Patent
Naylor

(10) Patent No.: US 9,212,786 B2
(45) Date of Patent: Dec. 15, 2015

(54) APPARATUS FOR PURGING CONTAINERS FOR STORING SENSITIVE MATERIALS

(75) Inventor: Stuart Naylor, Surrey (GB)

(73) Assignee: Roylan Developments Limited, Surrey (GB)

( * ) Notice: Subject to any disclaimer, the term of this patent is extended or adjusted under 35 U.S.C. 154(b) by 930 days.

(21) Appl. No.: 13/261,113

(22) PCT Filed: Jun. 30, 2010

(86) PCT No.: PCT/GB2010/051083
§ 371 (c)(1),
(2), (4) Date: Dec. 29, 2011

(87) PCT Pub. No.: WO2011/001178
PCT Pub. Date: Jan. 6, 2011

(65) Prior Publication Data
US 2012/0096740 A1    Apr. 26, 2012

(30) Foreign Application Priority Data

Jun. 30, 2009   (GB) .................................. 0911340.8
Oct. 12, 2009   (GB) .................................. 0917810.4

(51) Int. Cl.
*H01L 21/673* (2006.01)
*F17D 1/04* (2006.01)

(52) U.S. Cl.
CPC ............ *F17D 1/04* (2013.01); *H01L 21/67393* (2013.01)

(58) Field of Classification Search
CPC ................... H01L 21/67389; H01L 21/67393
USPC ............. 141/4, 59, 63, 91, 98, 197, 301–302; 206/701, 706; 414/935
See application file for complete search history.

(56) References Cited

U.S. PATENT DOCUMENTS

| | | | |
|---|---|---|---|
| 2,242,686 | A | 5/1941 | Tirrell |
| 3,715,860 | A | 2/1973 | Esty |
| 4,344,467 | A | 8/1982 | Lahde |
| 4,707,953 | A | 11/1987 | Anderson et al. |
| 4,961,322 | A | 10/1990 | Oguma et al. |
| 5,355,781 | A | 10/1994 | Liston et al. |

(Continued)

FOREIGN PATENT DOCUMENTS

| | | |
|---|---|---|
| DE | 197 53 185 A1 | 6/1999 |
| EP | 0 544 075 A1 | 6/1993 |

(Continued)

*Primary Examiner* — Nicolas A Arnett
(74) *Attorney, Agent, or Firm* — Breiner & Breiner, L.L.C.

(57) ABSTRACT

Apparatus for purging containers for the storage of sensitive materials is described. It includes means to connect a source of compressed purge gas to a purge gas inlet (2) on a container (1), including a pneumatically operated valve (6) adapted to allow purge gas to pass from the source to the inlet and a timing device (9) associated with the valve (6) and adapted to turn off the gas flow after a given time, and including means to vary the time between commencement and cessation of gas flow. The timing device is preferably one which operates on a pneumatic or clockwork basis, enabling the apparatus to operate without any electrical power supply, driven by the purge gas pressure alone. This enables the construction of a simple reliable unit, at a cost even enabling the unit to be incorporated into the container itself if desired. The use of a pneumatically operated valve enables portable apparatus to be designed with low power use if it includes e.g. electronic sensors to measure a property of the purge gas being exhausted from the container.

11 Claims, 5 Drawing Sheets

(56) References Cited

U.S. PATENT DOCUMENTS

| | | | |
|---|---|---|---|
| 5,794,408 A | 8/1998 | Patouraux et al. | |
| 5,799,495 A | 9/1998 | Gast, Jr. | |
| 5,806,574 A * | 9/1998 | Yamashita et al. | 141/63 |
| 5,960,708 A | 10/1999 | DeTemple et al. | |
| 5,988,233 A * | 11/1999 | Fosnight et al. | 141/63 |
| 6,013,293 A | 1/2000 | De Moor | |
| 6,023,915 A | 2/2000 | Colombo | |
| 6,113,671 A | 9/2000 | Garrett | |
| 6,123,120 A * | 9/2000 | Yotsumoto et al. | 141/65 |
| 6,135,168 A * | 10/2000 | Yang et al. | 141/98 |
| 6,221,163 B1 * | 4/2001 | Roberson et al. | 118/715 |
| 6,230,614 B1 | 5/2001 | Del Gallo et al. | |
| 6,468,353 B1 * | 10/2002 | Perlov et al. | 118/724 |
| 6,883,539 B2 * | 4/2005 | Inoue et al. | 137/565.23 |
| 6,901,971 B2 * | 6/2005 | Speasl et al. | 141/1 |
| 6,926,029 B2 * | 8/2005 | Inoue et al. | 137/565.23 |
| 7,077,173 B2 * | 7/2006 | Tokunaga | 141/66 |
| 7,360,346 B2 * | 4/2008 | Miyajima et al. | 53/432 |
| 7,650,835 B2 | 1/2010 | Stein | |
| 7,654,291 B2 * | 2/2010 | Miyajima et al. | 141/63 |
| 7,878,112 B2 | 2/2011 | Naylor | |
| 8,061,738 B2 * | 11/2011 | Okabe et al. | 285/110 |
| 8,171,964 B2 * | 5/2012 | Okabe | 141/63 |
| 8,240,346 B2 * | 8/2012 | Goto et al. | 141/65 |
| 8,297,319 B2 * | 10/2012 | Babbs et al. | 141/4 |
| 8,591,809 B2 * | 11/2013 | Ra et al. | 422/62 |
| 8,596,312 B2 * | 12/2013 | Natsume et al. | 141/98 |
| 2001/0041530 A1 | 11/2001 | Hara | |
| 2002/0177749 A1 | 11/2002 | Brown | |
| 2002/0194995 A1 * | 12/2002 | Shiramizu | 95/273 |
| 2003/0150334 A1 | 8/2003 | Gabler | |
| 2004/0101606 A1 | 5/2004 | Ling et al. | |
| 2004/0262187 A1 | 12/2004 | Schauer | |
| 2005/0224508 A1 | 10/2005 | Tajiri et al. | |
| 2006/0151354 A1 | 7/2006 | Dombroski et al. | |
| 2008/0099348 A1 * | 5/2008 | Naylor | 206/0.6 |
| 2008/0107506 A1 * | 5/2008 | Babbs et al. | 414/217 |
| 2009/0218773 A1 * | 9/2009 | Okabe et al. | 277/648 |
| 2011/0214778 A1 * | 9/2011 | Natsume et al. | 141/4 |

FOREIGN PATENT DOCUMENTS

| | | |
|---|---|---|
| GB | 1 587 534 A | 4/1981 |
| GB | 2 271 439 A | 4/1994 |
| JP | 02-242771 A | 9/1990 |
| WO | WO 99/35054 A1 | 7/1999 |
| WO | WO 2006/095121 A1 | 9/2006 |
| WO | WO 2008/125859 A1 | 10/2008 |

* cited by examiner

APPARATUS FOR PURGING CONTAINERS FOR STORING SENSITIVE MATERIALS

FIELD OF THE INVENTION

This invention relates to apparatus for purging containers for storing sensitive materials.

BACKGROUND OF THE INVENTION

WO 2006/095121 discloses apparatus and methods for storing sensitive materials in rigid sealable enclosures. After the sensitive materials, for example molecule compounds dissolved in DMSO, are placed in the enclosure, it is sealed and then purged using a purge gas and preferably left with the interior filled with inert gas at a pressure slightly above ambient so that if there is any problem with the sealing, the leakage occurs from the inside of the container to the outside rather than the other way round, which could lead to contamination and deterioration of the contents stored in the container.

The published specification discloses containers adapted for use in the method as well as a control unit which enables them to be purged and left under excess pressure.

The control unit described is adapted to detect the nature of the gas flow emerging from an exhaust port of the container, and to stop the purging process when the purging has reached an adequate level, for example by detecting that the oxygen level in the gas flow from the container has dropped below a preset concentration. Moisture level in the exhaust gas may also be monitored.

WO 2008/125859 discloses sealable rigid enclosures suitable for use with the apparatus disclosed in WO 2006/095121.

Other such apparatus has been described, for example in U.S. Pat. No. 4,344,467, and (in connection with inerting packaging covers) in U.S. Pat. No. 5,794,408. GB-A-1587534 discloses apparatus for providing a controlled atmosphere around perishable products such as fruit or vegetables located in a flexible bag.

BRIEF SUMMARY OF THE INVENTION

We have now found that by the use of the pressure from the purge gas supply, conventionally gas cylinders regulated to deliver a pressure of 4.2 to 5.6 kg/cm$^2$, it is possible to design control units which may be light in weight, allowing portability, and which may need no or only modest electrical power requirement to operate satisfactorily.

According to the present invention, there is provided apparatus for purging rigid sealable containers for the storage of sensitive materials, the containers having sealable inlet and exhaust ports comprising means to connect a source of compressed purge gas to a purge gas inlet on a container, including a pneumatically actuated main gas flow valve, means adapted to allow purge gas to pass from the source to a timing device associated with the main gas flow valve, means adapted to turn off the gas flow after a given time, and means to vary the time between commencement and cessation of gas flow. If the timing device is one which operates on a pneumatic or clockwork basis, driven in the former case by the pressure of the purge gas itself, it does not require any external electrical power supply such as would be required by a solenoid-operated valve.

In a simple embodiment, the time is set depending on the internal volume of the container to be purged, enabling adequate purging to be achieved without any monitoring of the gas flow from the container exhaust port. The larger the volume, the longer the time needed. Obviously the longer the purge time for a given volume, the greater the amount of purging, so such apparatus may be used to effect a standard purge or a 'super purge' (the latter taking longer). The apparatus may carry a simple table or other graphical representation enabling the user to read off the purge time once the volume of the container to purge and the desired purge level are known, whereafter the timer is set to the respective time and then operated once the container is connected to the outlet of the timer.

A pneumatically operated timer device may be selected from a variety of commercially available pneumatic timer units. One type consists of an arrangement of pneumatic components including a main control valve and a manually operated trigger valve which when operated allows gas flow to flow through the main control valve and a timer device which closes the main control valve after a given period of time, for example by sending a pneumatic signal to the main control valve. These various components may be assembled together to form such an arrangement, but it is also possible to use integrated pneumatic timers which essentially consist of a single integrated component.

If a supply of compressed gas is needed to operate the timer, this may be derived from the gas supply to the apparatus or from the gas supply within the apparatus which is fed to the container to be purged. The pressure of gas fed to the apparatus is usually within the range 4.2 to 5.6 kg/cm$^2$, while the pressure of the gas fed to the container to be purged is usually around 0.5 kg/cm$^2$.

In order to enable purging of the container to be carried out, the container must have both an inlet for the purge gas and an outlet for the passage of exhaust gas from the interior of the container as it is purged. The inlet is usually configured as a self-sealing fitting to which a feed conduit for purge gas may be connected. The outlet may be a simple self-sealing port which allows flow when the pressure within the container is above ambient by a given amount, or it may take the form of a self-sealing fitting to which an exhaust conduit may be connected for the following purpose:

As noted above, it is desirable to leave the container interior above ambient pressure after purging, and for that purpose the apparatus preferably includes a pressure relief valve which can be connected between the exhaust port of the container and an exhaust port on the apparatus itself so that at the end of purging the container is detached from the apparatus in a sealed condition and with an internal pressure of e.g. 0.035 to 0.070 kg/cm$^2$ above ambient. Preferably the pressure relief valve is arranged to operate in the exhaust flow from the container only at the end of the purge time—if it is connected throughout purging the back pressure generated increases the purge time necessary to achieve the desired purge level. Operating in this way, the main purging takes place with the exhaust from the container simply vented to atmosphere, and at the end of the set purge time the pressure relief valve is applied to leave the internal pressure at the desired overpressure.

The detailed construction of the apparatus may vary widely; it can be made up of individual pneumatic components connected together by piping, or some or all of the components may be integrated into a single block or manifold specifically designed and constructed to operate in the same way.

Alternatively, the apparatus may even be incorporated into a container itself, and this is of particular value where the container is of large capacity and designed to contain high-value materials, for example a substantial number of chemical or biological samples. In such a case, the purge gas supply, usually a gas cylinder, is simply connected to the inlet port on the container and the container interior may be purged simply by connecting the high pressure source of purge gas to the inlet, setting the timer and triggering purging. Triggering may occur manually or, for example, automatically on clamping a container lid or door in place after the container has been loaded with the materials it is desired to store under inert conditions. Because the size of the container is known, the range of timings available may be relatively narrow, though it will still be variable to enable a choice between a shorter purge time and a longer 'superpurge' time, and the necessary time to achieve adequate purging will also depend on whether the container is fully loaded with little airspace or lightly loaded with a lot of airspace (in the latter case longer purge times being needed to achieve the same purge quality).

As described in WO 2006/095121, the ending of purging may be triggered by detecting a property of the exhaust gas, for example moisture content or oxygen content, using suitable sensors and associated circuitry. Because the main valve controlling the feed of purge gas through the chamber is pneumatically operated, the power requirements for such control are modest if electrically operated trigger valves are used, avoiding the need for power-hungry solenoid valves.

BRIEF DESCRIPTION OF THE DRAWING

The accompanying drawings show by way of example how the invention may be put into practice. In the drawings.

DETAILED DESCRIPTION OF THE INVENTION

Figure 1:
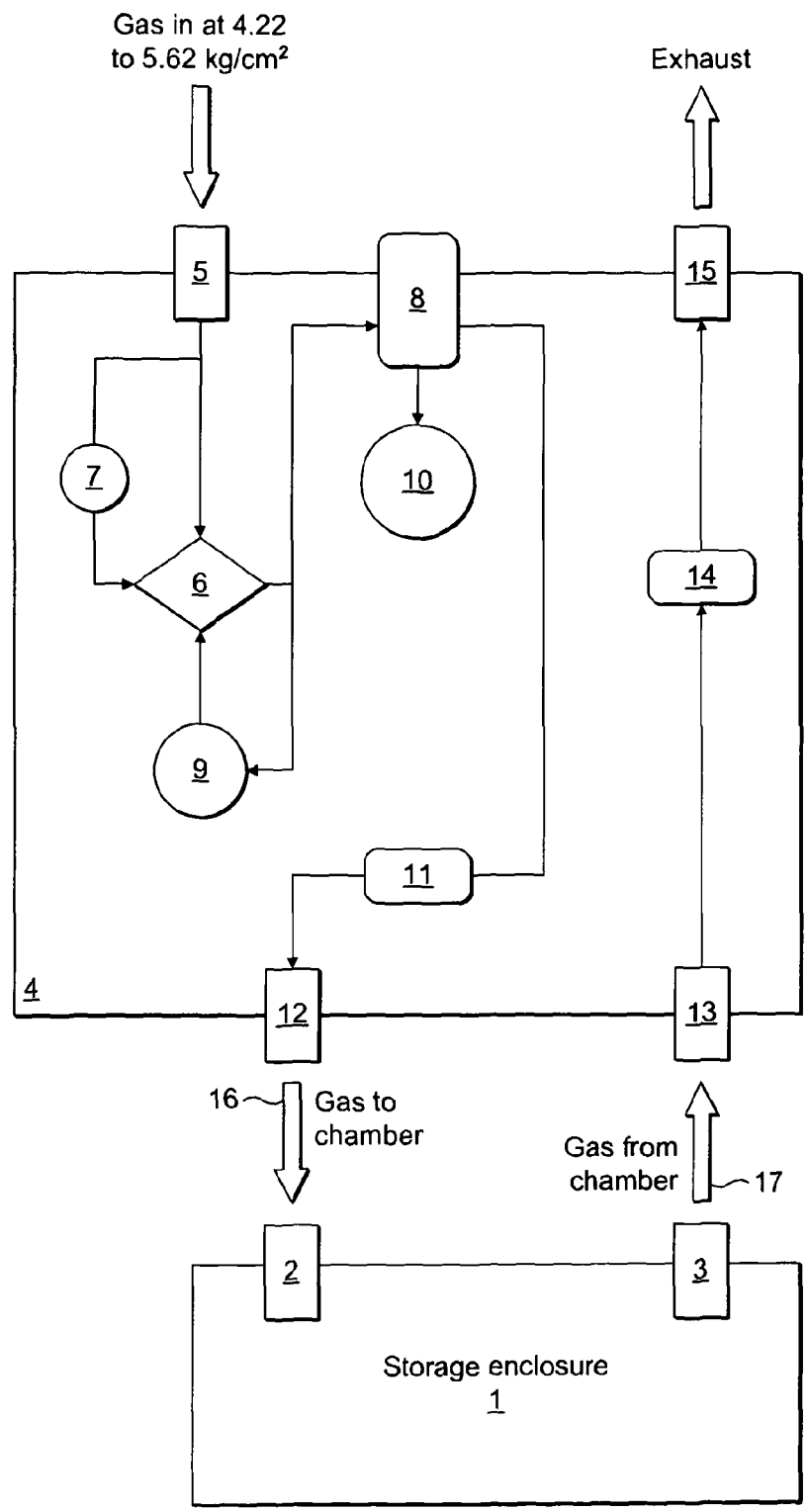
FIG. 1 shows diagrammatically a first embodiment of apparatus according to the present invention in use.
Figure 2:
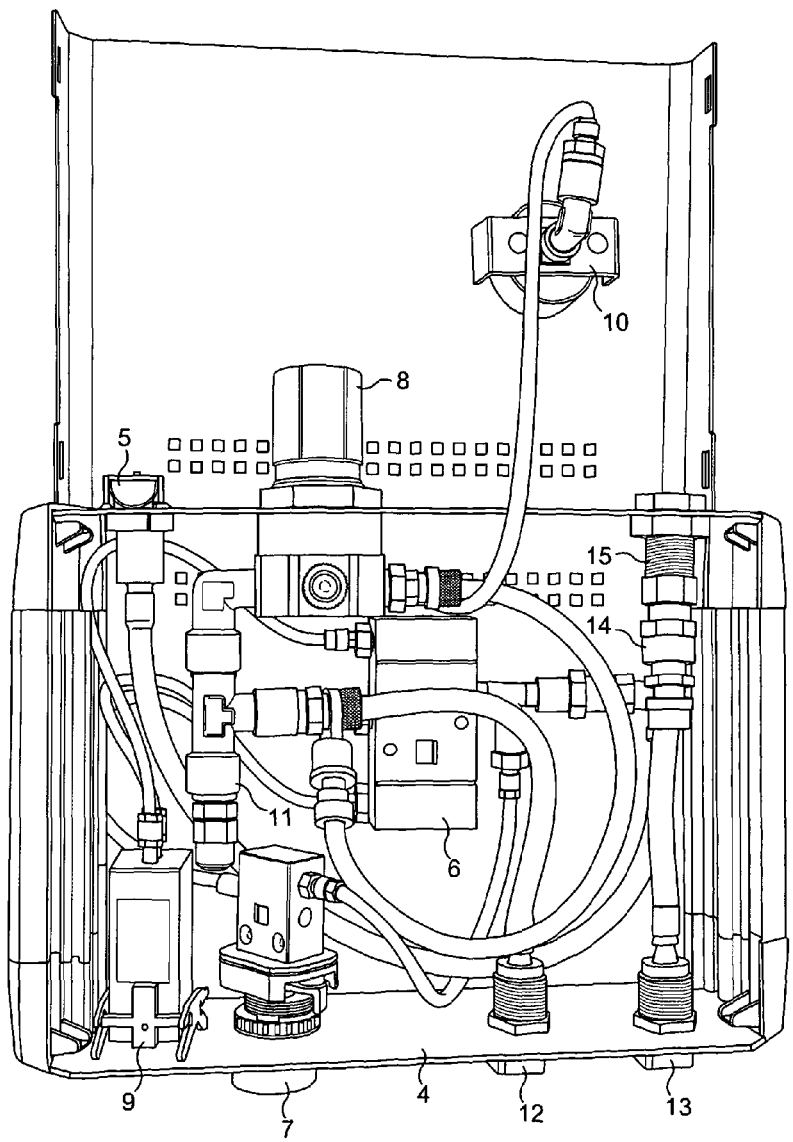
FIG. 2 is a view of the apparatus shown diagrammatically in FIG. 1, showing how the various components of the apparatus of FIG. 1 may be arranged in a practical fashion, with the lid swung back to reveal the individual components inside the outer casing.

Referring to FIGS. 1 and 2 of the drawings, a purgeable rigid sealable storage container 1 of known design is provided with an inlet valve 2 and an exhaust valve 3, and is shown diagrammatically at the foot of FIG. 1. Valves 2 and 3 are both simple hose coupling valves which seal in the absence of excess pressure applied from the outside in the case of valve 2 and from the inside in the case of valve 3.

The apparatus according to the invention is shown diagrammatically in the top portion of FIG. 1 and illustrated in FIG. 2 which is a plan view, with the lid swung back, of a casing 4 containing the relevant components to carry out controlled purging of the storage container 1. The various components arranged on or in the casing 4. These include an inlet connector 5 which is connected to both a pneumatically actuated main control valve 6 and a trigger valve 7 mounted on the front panel of casing 4. Trigger valve 7 is connected to the main control valve 6, which is also connected to a pressure regulator 8 and a timer 9. A panel-mounted pressure gauge 10 is connected to the outlet of regulator 8, and set in the top cover portion of casing 4, and the outlet of regulator 8 is connected, via a safety blow-off valve 11 to an outlet connector 12 mounted on the front panel of casing 4.

Separately, casing 4 has an inlet connector 13, relief valve 14 and an outlet (exhaust) connector 15. A silencer may be fitted to connector 14 if desired.

A typical timer for use in such apparatus may be a clockwork-based pneumatic timer such as those produced by H Kuhnke Limited, with a timing range of, for example, 20 to 300 seconds.

In order to use the apparatus, connector hoses 16 and 17 are fitted between outlet 12 of the apparatus and inlet 2 on the enclosure and outlet 3 on the enclosure and inlet 13 on the apparatus respectively. A high pressure gas source, for example a nitrogen cylinder, is connected to inlet 5 and the outlet from that high pressure source then enabled, for example, by opening a standard hand wheel controlled valve on the top of the cylinder.

To start with, gas from the compressed gas cylinder does not flow through main control valve 6, as this is normally closed. The timer 9 is then set to a desired purging time, and the trigger valve 7 actuated. This delivers a pneumatic signal to the main control valve 6 causing it to open and gas to flow through it to the pressure regulator 8, and to the timer. The reduced pressure (the exact pressure under which gas is being fed into the enclosure 1 during operation is shown on meter 10) purge gas flows via the safety blow-off valve 11 to outlet 12 and thence into the chamber 1, and the exhaust gas from enclosure 1 then flows via outlet 3 and inlet 13 through the apparatus again, via relief valve 14, and out through connector 15.

The flow continues until the time set on the timer 9 (which particular setting would depend upon the volume of container 1 which is to be purged as well as on the degree of purging required) expires, which sends a pneumatic signal to the main control valve 6 returning it to its normally closed state, so that the purge gas ceases to flow into the storage enclosure 1. At that point, the pressure relief valve 14 operates to maintain the pressure in the storage enclosure 1 from 0.035 to 0.070 $kg/cm^2$ above ambient.

The storage enclosure 1 is then disconnected from the apparatus by simply dismounting the connections to ports 2 and 3 which, being self-sealing, act to maintain the atmosphere inside the storage enclosure 1 at slightly above ambient pressure.

Figure 3:
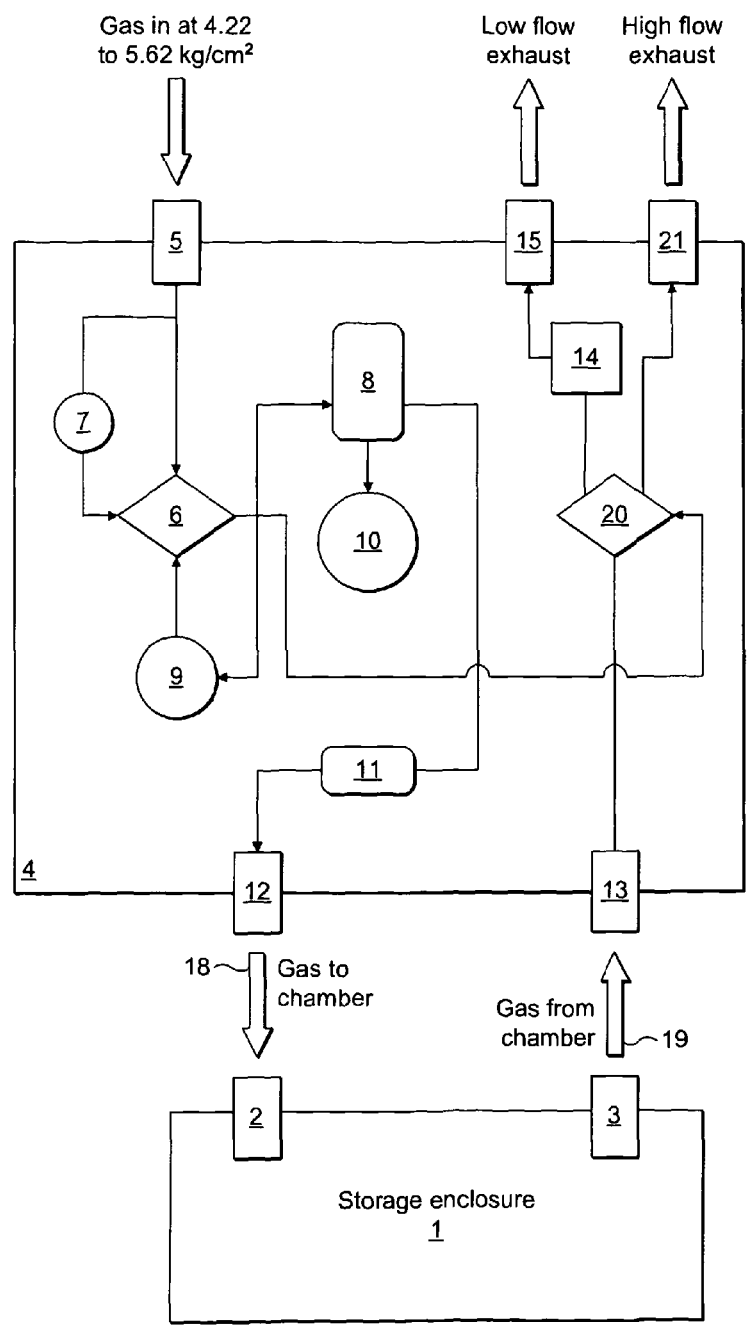
FIG. 3 is a diagram similar to FIG. 1 but showing an improved apparatus according to the present invention.
Figure 4:
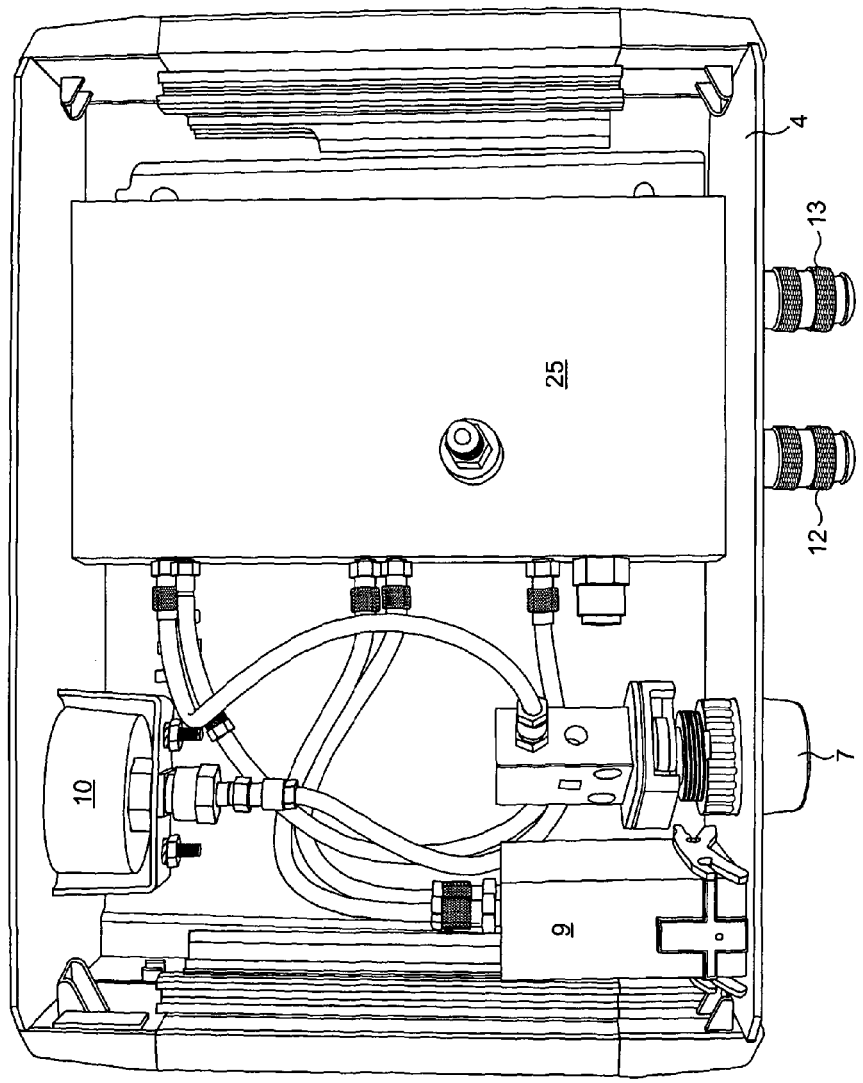
FIG. 4 is a view of the apparatus shown in FIG. 3 showing a practical means of incorporating the components of the apparatus in a casing.

Referring now to FIGS. 3 and 4 of the drawings, the apparatus according to the invention is similar to that shown in FIG. 1, but is improved by the addition of a diverter valve 20 which is adapted to connect the flow of gas from the container either to a simple high flow exhaust port 21 or to a pressure relief valve 14 between diverter valve 20 and exhaust port 15. This enables more rapid purging to be carried out.

The apparatus shown in FIG. 3 is operated in similar fashion to that described above. First connector hoses 16 and 17 are fitted between outlet 12 of the apparatus and inlet 2 on the enclosure and outlet 3 on the enclosure and inlet 13 on the apparatus and the high pressure gas source connected and turned on.

The timer 9 is then set to a desired purging time, and the trigger valve 7 actuated.

This delivers a signal to the pneumatically actuated main control valve 6 causing it to open and gas to flow through it to the pressure regulator 8, to the timer and to the diverter valve 20 causing it to direct the purge gas exhaust flow to the high flow exhaust port 21.

The flow continues until the time set on the timer 9 (which particular setting would depend upon the volume of enclosure 1 which is to be purged as well as on the degree of purging required) expires, which sends a pneumatic signal to the main control valve 6 returning it to its normally closed state, so that the purge gas ceases to flow into the storage enclosure 1. At that same point, the diverter valve 20 operates to immediately switch the purge gas flow via pressure relief valve 14 to the low flow exhaust 15, so that the purge gas flows out only until the pressure within the storage enclosure 1 is 0.035 to 0.070 kg/cm$^2$ above ambient.

The storage enclosure 1 is then disconnected from the apparatus by simply dismounting the connections to ports 2 and 3 which, being self-sealing, act to maintain the atmosphere inside the storage enclosure 1 at slightly above ambient pressure.

As shown in FIG. 4, the majority of the components may be incorporated into an integrated valve block 25 to which the other components are connected via pneumatic hoses.

Figure 5:
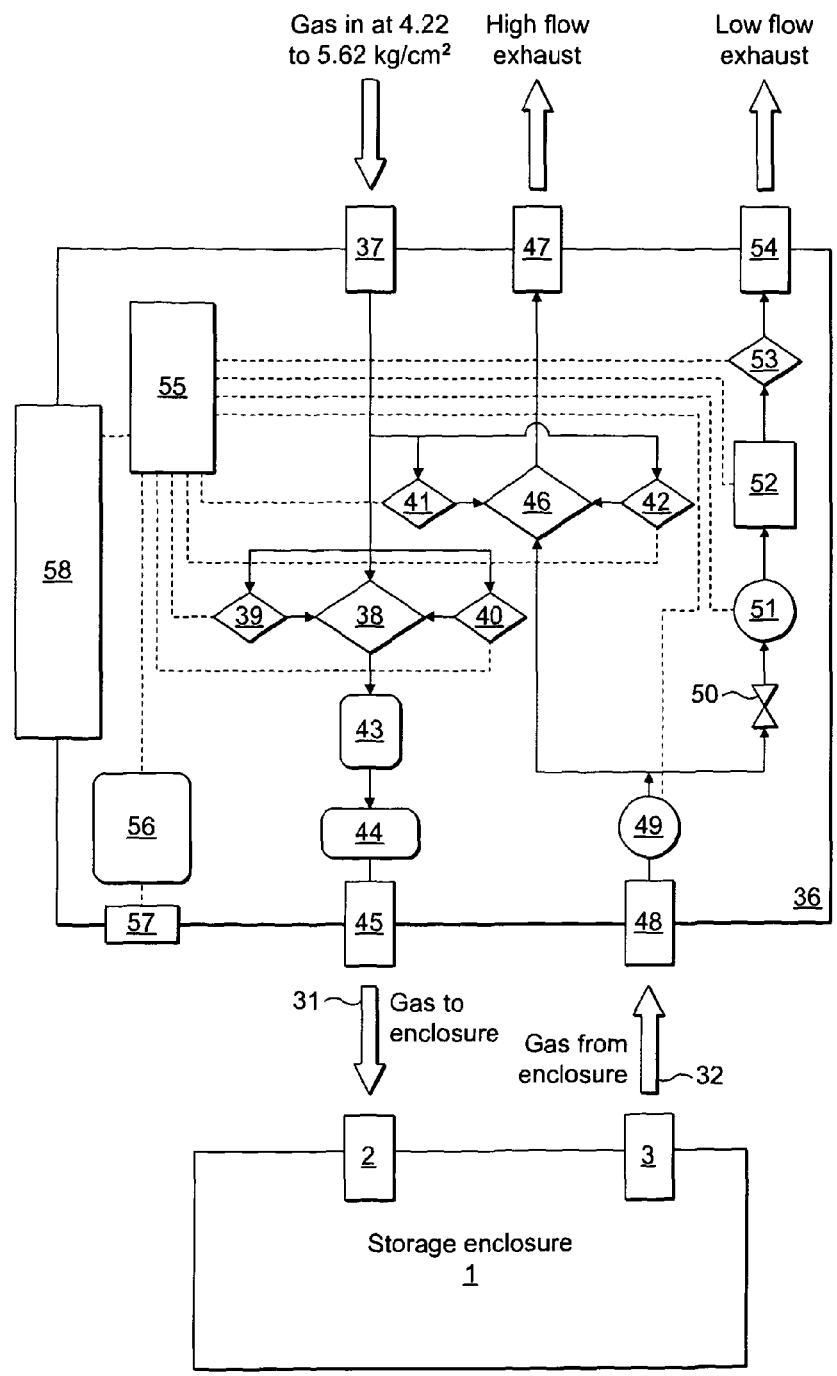
FIG. 5 is a diagram similar to FIG. 3 showing a preferred embodiment of apparatus according to the present invention, incorporating a low power requirement electronic control system.

Referring now to FIG. 5, the purgeable storage container or enclosure 1 is provided with a valved inlet connector 2 and a valved exhaust connector 3. Valved connectors 2 and 3 are both simple hose coupling valves which self seal when connector hoses 31 and 32 are detached from them, leaving container or enclosure 1 with a gas tight seal, all as in FIGS. 1 and 3.

The apparatus shown in FIG. 4 has a casing 36 which contains the operative components to carry out the purging of the storage container 1. The various components are arranged on or in the casing 36. These include a purge gas inlet connector 37 which is connected to a main control valve 38 and a four trigger valves 39, 40, 41 and 42. Trigger valves 39, 40, 41 and 42 are electrically latchable trigger valves, the latching having the effect of reducing their power consumption when engaged.

Trigger valves 39 and 40 are connected to the main control valve 38, which is connected to pressure regulator 43. Pressure regulator 43 is connected to safety blow-off valve 44, which connects to outlet connector 45. Blow-off valve 44 may be configured to start blow off purge gas if the gas pressure being delivered into the enclosure 1 exceeds a predetermined safe working enclosure pressure.

Trigger valves 41 and 42 are connected to high flow exhaust control valve 46, which is connected to outlet exhaust connector 47. A silencer may be fitted to outlet connector 47 if desired.

Inlet connector 48 is connected to pressure sensor 49. Pressure sensor 49 is connected to high flow exhaust control valve 46 and a low flow exhaust needle valve 50.

Low flow exhaust needle valve 50 is connected to a low flow exhaust pump 51, which connects to a low flow exhaust humidity and oxygen sensor module 52.

Low flow exhaust humidity and oxygen sensor module 52 connects to a low flow exhaust valve 53, which connects to an outlet connector 54. A silencer may be fitted to outlet connector 54 if desired.

The system is operated and controlled using main control printed circuit board (PCB) 55, which interfaces with interface item 58, which may be a touch screen display, or a display with an arrangement of input buttons, or an arrangement of input buttons and output lights/light emitting diodes (LEDs).

Main control PCB 55 is connected to an onboard battery 56, which connects to an inlet charge lead connector 57. Inlet charge lead connector 57 may be a universal serial bus (USB) type connector.

Main control PCB 55 also controls and measures feedback from trigger valves 39, 40, 41 and 42, pressure sensor 49, low flow exhaust pump 51, low flow exhaust humidity and oxygen sensor module 52 and low flow exhaust valve 53.

In order to use the apparatus, connector hoses 31 and 32 are fitted between outlet 45 of the apparatus and valved inlet connector 2 on the enclosure and inlet 48 of the apparatus and valved outlet connector 3 on the enclosure respectively. A high pressure gas source, for example a nitrogen cylinder, is connected to inlet 7 and the outlet from that high pressure source then enabled, for example, by opening a standard hand wheel controlled valve on the top of the cylinder.

To start with, compressed gas does not flow through main control valve 38, which is normally closed. The operator configures the system using the interface 58 to program the main control PCB 55, by setting exhaust gas content moisture and oxygen cut off thresholds to be detected by low flow exhaust humidity and oxygen sensor module 52. The operator then starts the purge cycle using interface 58.

Main control PCB 55 accepts the start signal from interface 58 and electrically fires trigger valves 39 and 41, opens low flow exhaust valve 53 and starts low flow exhaust pump 51. Pneumatic signals are sent to main flow control valve 38 by trigger valve 39 and high flow exhaust valve 46 by trigger valve 41. Main flow control valve 38 and high flow exhaust valve 46 are both opened pneumatically allowing purge gas to start flowing through pressure regulator 43 and subsequently through safety blow off valve 44.

Purge gas is then forced to flow through outlet 45 and connector hose 31 into enclosure 1 via valved connector 2. Purge gas then mixes with the ambient gas within enclosure 1 and is forced to flow out of enclosure 1 under pressure via valved outlet connector 3.

Upon exiting valved outlet connector 3 the exhausted purge gas flows through connector hose 32 and connector 18 into the apparatus again.

The exhausted purge gas flows to pressure sensor 49 which measures the gas pressure and delivers the exhaust gas to separate high and low flow exhaust paths/lines.

The majority of exhausted purge gas flows from pressure sensor 49 through high flow exhaust valve 46 and then out of connector 47.

A small amount of exhausted purge gas also flows from pressure sensor 49 through low flow exhaust needle valve 50 and low flow exhaust pump 51, which regulates the quantity of exhaust gas flowing into low flow exhaust humidity and oxygen sensor module 52. Exhausted purge gas then flows from oxygen sensor module 52 through opened low flow exhaust valve 53 and out of connector 54. Connector 54 may be fitted with a silencer.

Exhaust humidity and oxygen sensor module 52 is measuring the levels of oxygen and or moisture in the exhausted purge gas as this purge gas flows through and over it. When these levels fall below the preset set cut off thresholds programmed into main control PCB 55 by interface 58, main control PCB 55 disengages trigger valves 39 and 41 and fires trigger valves 40 and 42. Pneumatic signals are sent to main flow control valve 38 by trigger valve 40 and high flow exhaust valve 46 by trigger valve 42. Main flow control valve 38 and high flow exhaust valve 46 are both closed pneumatically ceasing the flow of purge gas through the apparatus into enclosure 1 and ceasing the flow of exhaust gas from enclosure 1 into the apparatus.

By the careful control and synchronised timing of closing high flow exhaust valve 46 with respect to closing main control valve 38 a level of positive pressure above ambient is trapped within enclosure 1 and forced to flow from the enclosure 1 only via the low flow exhaust path, that starts with low flow exhaust needle valve 50 and finished with outlet 54.

71 Exhaust gas flows at a reduced rate via the low flow exhaust path with pressure sensor 49 measuring the system pressure within the enclosure 1 still connected to the apparatus. Optionally, low flow exhaust humidity and oxygen sensor module 52 may continue to sense the oxygen and moisture content of the exhausted purge gas as pressurised exhausted purge gas is vented from enclosure 1 through the apparatus low flow exhaust line. This may be of an advantage, as the mixing of purge gas with the pre-existing ambient gas within the enclosure 1 may change when the main purge cycle through the high flow exhaust has completed. Pockets of dead or un-purged ambient gas may be suddenly released within enclosure 1 and detected when passing through low flow exhaust humidity and oxygen sensor module 52. In this instance the apparatus may be configured in Main control PCB 55 to re-start the purging process.

Upon reaching a pre-set level of positive pressure, measured by pressure sensor 49 and programmed into main control PCB 55 by interface 58, main control PCB 55 closes low flow exhaust valve 53 sealing off enclosure 1 completely. Main control PCB 55 also terminates the gas pumping operation of low flow exhaust pump 51 and the overall purge cycle of enclosure 1 using the apparatus completes.

However, it may be that an elevated level of positive pressure is required within enclosure 1 not achieved naturally at the end of the purge cycle. In this instance main control valve 38 is opened momentarily and then closed by trigger valves 39 and 40 under the control of main control PCB 55. Thus main control valve 38's open and closed state is modulated to cause the pressure within enclosure 1 to increase incrementally. Pressure sensor 49 is able to detect the pressure increase which is in turn monitored by main control PCB 55. Upon reaching the required level of positive pressure within enclosure 1, as measured by pressure sensor 49, the modulation of main control valve 38 is terminated.

Enclosure 1 is now disconnected from the apparatus by disengaging hoses 31 and 32 from valved connectors 2 and 3 respectively. As valved connectors 2 and 3 are normally closed self sealing valves they seal off the environment within enclosure 1 immediately upon their disconnection, thus presenting enclosure 1 as a gas tight enclosure.

The invention claimed is:

1. An apparatus for purging rigid sealable containers for storage of sensitive materials, the containers having a sealable inlet port and a sealable exhaust port, comprising means to connect a source of compressed purge gas to a purge gas inlet on a container, including a main gas flow valve; means adapted to allow purge gas to pass from the source of compressed purge gas to a timing device associated with the main gas flow valve, wherein the main gas flow valve turns off a gas flow after a preselected time, and the timing device can vary a time period between commencement and cessation of the gas flow; and means to detach the apparatus from the purge gas inlet; wherein the main gas flow valve is structured for pneumatic activation and to enable purge gas pressure provided by the source of compressed purge gas to operate the apparatus to purge the container in absence of an electrical power supply.

2. The apparatus according to claim 1 wherein the timing device operates on a pneumatic basis or clockwork basis.

3. The apparatus according to claim 2 further comprising a pressure relief valve connected to the exhaust port of the container so that at an end of purging of the container, the container is detached from the apparatus in a sealed condition and with an internal pressure greater than ambient pressure.

4. The apparatus according to claim 3 wherein the pressure relief valve is adapted to operate in an exhaust flow from the container only at an end of a predetermined purge time.

5. A storage container for sensitive materials incorporating the apparatus according to claim 2.

6. The apparatus according to claim 1 further comprising a pressure relief valve connected to the exhaust port of the container so that at an end of purging of the container, the container is detached from the apparatus in a sealed condition and with an internal pressure greater than ambient pressure.

7. The apparatus according to claim 6 wherein the pressure relief valve is adapted to operate in an exhaust flow from the container only at an end of a predetermined purge time.

8. The apparatus according to claim 1 further comprising means to purge the container in a two-stage process, wherein the two-stage process includes a first stage at a relatively high purge gas flow rate and a second stage at a relatively low purge gas flow rate.

9. The apparatus according to claim 8 further comprising a pneumatically-operated diverter valve to switch an exhaust purge gas flow from a high-capacity high flow path to a low flow path including a sensor to detect a property of an exhaust purge gas.

10. A storage container for sensitive materials incorporating the apparatus according to claim 1.

11. A storage container according to claim 10 further comprising means for triggering purging actuated by closure of the container.

* * * * *